(12) United States Patent
Wang et al.

(10) Patent No.: US 10,644,718 B1
(45) Date of Patent: May 5, 2020

(54) SINGLE-LOOP LINEAR-EXPONENTIAL MULTI-BIT INCREMENTAL ANALOG-TO-DIGITAL CONVERTER

(71) Applicant: University of Macau, Macau (CN)

(72) Inventors: Biao Wang, Macau (CN); Sai-Weng Sin, Macau (CN); Franco Maloberti, Macau (CN); Rui Paulo da Silva Martins, Macau (CN)

(73) Assignee: University of Macau, Macau (CN)

( * ) Notice: Subject to any disclaimer, the term of this patent is extended or adjusted under 35 U.S.C. 154(b) by 0 days.

(21) Appl. No.: 16/404,791

(22) Filed: May 7, 2019

(51) Int. Cl.
*H03M 1/12* (2006.01)
*H03M 3/00* (2006.01)
*H04L 27/20* (2006.01)
*H04B 1/00* (2006.01)
*H03M 1/08* (2006.01)

(52) U.S. Cl.
CPC ............ *H03M 3/454* (2013.01); *H03M 1/08* (2013.01); *H03M 1/12* (2013.01); *H04B 1/0021* (2013.01); *H04L 27/2032* (2013.01)

(58) Field of Classification Search
CPC .......... H03M 1/08; H03M 1/12; H03M 3/454; H04B 1/0021; H04L 27/2032
USPC ................................................. 341/125–155
See application file for complete search history.

(56) References Cited

U.S. PATENT DOCUMENTS

| | | | | | |
|---|---|---|---|---|---|
| 5,157,395 | A | * | 10/1992 | Del Signore | ...... H03H 17/0294 341/143 |
| 5,257,026 | A | * | 10/1993 | Thompson | ............ H03M 3/388 341/118 |
| 5,590,065 | A | * | 12/1996 | Lin | ..................... H03H 17/0286 708/313 |
| 5,696,708 | A | * | 12/1997 | Leung | .................... H03H 17/06 708/313 |

(Continued)

OTHER PUBLICATIONS

Wang, et al., "A 550 μW 20 kHz BW 100.8 DB SNDR linear-exponential multi-bit incremental converter with 256-cycles in 65 nm CMOS," Proc. IEEE Symp. VLSI Circuits, Jun. 2018, pp. 207-208.

(Continued)

*Primary Examiner* — Lam T Mai
(74) *Attorney, Agent, or Firm* — Spruson & Ferguson (Hong Kong) Limited

(57) ABSTRACT

An incremental analog-to-digital converter (IADC) with a two-phase linear-exponential accumulation loop for improving the signal to noise distortion ratio (SNDR) and the dynamic range (DR) is disclosed. The linear-exponential IADC includes an analog modulator and a decimation filter. The analog modulator has an input for receiving the analog input voltage and an output. The analog modulator includes an integrator, an adder, a quantizer, a noise-coupling path, a data weighted averaging (DWA) circuit, and a digital-to-analog converter (DAC). The decimation filter has an input for receiving signals from the output of the analog modulator. The decimation filter includes a $1^{st}$ order accumulator, (Continued)

an exponential accumulator, and a decimator. The linear-exponential IADC is configured to operate with a linear phase for suppressing the thermal noise and an exponential phase for boosting the SQNR.

20 Claims, 12 Drawing Sheets

(56) References Cited

U.S. PATENT DOCUMENTS

| | | | | |
|---|---|---|---|---|
| 5,729,225 | A * | 3/1998 | Ledzius | H04H 60/04 341/61 |
| 5,964,708 | A * | 10/1999 | Freeman | G01S 7/52028 600/447 |
| 6,002,355 | A * | 12/1999 | Del Signore | H03M 1/12 327/534 |
| 6,234,658 | B1 * | 5/2001 | Houldsworth | G06F 17/10 341/77 |
| 6,271,780 | B1 * | 8/2001 | Gong | H03M 3/488 341/139 |
| 6,356,872 | B1 * | 3/2002 | Leung | G10L 21/0364 704/229 |
| 6,867,720 | B1 * | 3/2005 | Freeman | G01S 7/52028 341/143 |
| 8,405,535 | B1 * | 3/2013 | Xiao | H03M 3/394 341/143 |
| 9,484,890 | B1 * | 11/2016 | Cazzaniga | G01C 19/5726 |
| 2003/0053793 | A1 * | 3/2003 | Holzmann | G11C 7/16 386/328 |
| 2005/0093726 | A1 * | 5/2005 | Hezar | H03M 3/412 341/143 |
| 2006/0104383 | A1 * | 5/2006 | Jensen | H04B 1/0007 375/295 |
| 2017/0205772 | A1 * | 7/2017 | Burg | H03L 7/091 |

OTHER PUBLICATIONS

Wang, Biao, et al., "A 550-µW 20-kHz BW 100.8-dB SNDR Linear-Exponential Multi-Bit Incremental Σ Δ ADC With 256 Clock Cycles in 65-nm CMOS," IEEE Journal of Solid-State Circuits, Jan. 8, 2019, vol. 54, No. 4.

Y. Liu, et al., "A 105-dB SNDR, 10 kSps multi-level second-order incremental converter with smart-DEM consuming 280 µW and 3.3-V supply," Proc. IEEE Eur. Solid-State Circuits Conf. (ESSCIRC), Sep. 2013, pp. 371-374.

P. Vogelmann, et al., "A 1.1 mW 200kS/s incremental Σ Δ ADC with a DR of 91.5 dB using integrator slicing for dynamic power reduction," IEEE Int. Solid-State Circuits Conf. (ISSCC) Dig. Tech. Papers, Feb. 2018, pp. 236-237.

Y. Zhang, et al., "A 35 µW 96.8dB SNDR 1 kHz BW multi-step incremental ADC using multi-slope extended counting with a single integrator," Proc. IEEE Symp. VLSI Circuits, Jun. 2016, pp. 24-25.

T. Katayama, et al., "A 1.25 MS/s two-step incremental ADC with 100dB DR and 110dB SFDR," Proc. IEEE Symp. VLSI Circuits, Jun. 2018, pp. 205-206.

* cited by examiner

SINGLE-LOOP LINEAR-EXPONENTIAL MULTI-BIT INCREMENTAL ANALOG-TO-DIGITAL CONVERTER

FIELD OF THE INVENTION

The present invention generally relates to an incremental analog-to-digital converter. In particular, the present invention relates to an incremental analog-to-digital converter with a two-phase linear-exponential accumulation loop for improving the signal to noise distortion ratio (SNDR) and the dynamic range (DR).

PRIOR DISCLOSURES BY THE INVENTOR OR A JOINT INVENTOR

Part of the present invention was disclosed in a conference paper published in the 2018 *Symposium on VLSI Circuits Digest of Technical Papers* (DOI: 10.1109/VLSIC.2018.8502384) [1] on 18-22 Jun. 2018. Part of the present invention was also disclosed in a paper published in the *IEEE Journal of Solid-State Circuits* (DOI 10.1109/JSSC.2018.2888872) [2] on 8 Jan. 2019. Both papers are grace period inventor-originated disclosures disclosed within one year before the effective filing date of this application.

BACKGROUND

Analog-to-digital conversion is a process of converting an input analog voltage (or current) into a digital format. There are many different analog-to-digital conversion architectures, such as flash, successive approximation register (SAR), pipelined, and oversampling.

Generally, oversampling has been used to implement high-resolution analog-to-digital converters (ADCs). For the conventional delta-sigma modulator or the noise-shaping SAR, the following decimation filter requires order-dependent differentiators, resulting in long latency.

On the contrary, incremental ADCs (IADCs) provide a Nyquist-like conversion with a periodic memory clearing both in the analog modulator and the digital decimator. Therefore, IADCs have drawn attention as an alternative candidate to the sigma-delta ADC for applications in sensors, wearable devices, and instrumentation for its low-latency, easy multiplexing, and simple digital filtering properties. Meanwhile, the IADC is a Nyquist-type ADC and suffers no idle tone, which allows it to become a good candidate for the high-performance audio system.

In a first-order IADC, the required number of clock cycles is $2^N$ for an N-bit resolution. First-order structures are slow due to the required large number of clock cycles, but the first-order sample weightings are uniform, making the thermal noise reduction and the data weighting average very effective. On the other hand, a high-order structure can significantly reduce the number of clock cycles, increasing the bandwidth (BW) or reducing the op-amp power for the same BW. However, a high-order structure causes non-uniform sample weightings, reducing the effectiveness of data weighted averaging (DWA) and thermal noise suppression by oversampling.

For a second-order incremental zoom-ADC, DWA technique is utilized to diminish the impact of digital-to-analog converter (DAC) mismatch errors. The linearly decreasing weighting of the second-order structure reduces the effectiveness of the DWA technique. With an oversampling ratio (OSR) of 2 k, the achieved linearity is 6 ppm. In addition, this architecture suffers from an input-clipping problem, and it is more suitable for a dc signal. A smart dynamic element matching (DEM) algorithm from [3], determinedly selecting the capacitor elements in a Tetris' way, was proposed to compensate for the DAC element mismatch. However, the algorithm complexity increases exponentially with the order, quantizer bit, and OSR. Meanwhile, both works have a thermal noise penalty factor of 1.3. In the work by Vogelmann, et. al. [4], a dynamic integrator slicing technique was presented to reduce the first integrator's power by utilizing the input weighting function. However, there is a tradeoff between the first integrator power and the input signal power, such that the effectiveness of the integrator slicing technique depends on the weighting function. For the first order, this technique is not effective because of the originally uniform weighting, while high-order architectures inherently suffer from a thermal noise penalty (a factor of 1.8 in the third-order structure). Meanwhile, it used a single-bit quantizer to keep the linearity, because of the squarely decreasing DAC weighting. As a consequence, the loop demands power-hungry op-amps for a large output swing.

Hybrid combinations of incremental delta-sigma and Nyquist ADCs have been proposed to improve the converter efficiency. A multi-step IADC with a single op-amp [5] uses multi-slope extended counting to achieve 16-bit resolution with 320 clock cycles. With the non-amplified residue voltage being processed at the back-end stages, the limitation of the backend resolution is the comparator noise, especially at low supply. A long-conversion time is required to resolve more bits in the first stage when the overall resolution increases. In addition, the first stage employs a single-bit quantizer. Therefore, the loop needs a power-hungry op-amp. In the work from Katayama et. al. [6], a two-step scheme uses a high-resolution flash ADC and a multi-bit DAC to reduce the op-amp swing and to relax the errors in the second stage. However, the 31-level quantizer increases the areas of the flash and the DWA logic. The cyclic ADC needs an extra capacitor to store the residue voltage, which reduces the feedback factor. The two-step architecture is more sensitive to the inter-stage gain error.

In view of the deficiency of above ADCs, there is a need in the art to have a single-loop two-phase exponential incremental converter that accumulates the residue in a fast and stable approach. In particular, the incremental converter operates as a first-order IADC in the first phase to accumulate the signal linearly and suppress the thermal noise, and then the incremental ADC enables a noise coupling (NC) path to boost the signal-to-quantization-noise ratio (SQNR) exponentially in the second phase.

SUMMARY OF THE INVENTION

It is an object of the present disclosure to provide a linear-exponential incremental analog-to-digital converter (IADC) with improved signal to noise distortion ratio and dynamic range.

In accordance with certain embodiments of the present disclosure, the linear-exponential IADC includes an analog modulator and a decimation filter. The analog modulator has an input for receiving the analog input voltage and an output. The analog modulator includes an integrator, an adder, a quantizer, a noise-coupling path, a data weighted averaging (DWA) circuit, and a digital-to-analog converter (DAC). The decimation filter has an input for receiving signals from the output of the analog modulator. The decimation filter includes a $1^{st}$ order accumulator, an exponential accumulator, and a decimator. The linear-exponential IADC is configured to operate with a linear phase and an exponential phase. The first integrator, the adder, and the quantizer are activated during a linear phase to accumulate a signal linearly. The NC path and the exponential accumulator are activated during an exponential phase to create an exponentially accumulating loop for boosting a SQNR. The linear phase and the exponential phase are configured to operate for $N_L$ and $N_E$ clock cycles respectively, wherein $N_L$ and $N_E$ are determined in accordance with a clock cycles distribution.

In accordance with a further aspect of the present disclosure, the first integrator is configured to convert a sum of signals received at an input terminal to an output signal indicative of an integral, with respect to time, of the sum of the signals received.

In accordance with a further aspect of the present disclosure, the first integrator utilizes a chopping technique using a non-overlapping chopping clock.

In accordance with a further aspect of the present disclosure, the first integrator implements a complementary telescopic cascode architecture.

In accordance with a further aspect of the present disclosure, the NC path feeds a quantizer noise back to an input of the quantizer, wherein the NC path comprises ping-pong capacitor arrays having a pair of matching capacitors ($C_{ho}$ and $C_{he}$) and a plurality of switches for charging the pair of matching capacitors at alternating clock cycles. The ping-pong capacitor arrays further comprise an even part and an odd part. The even and odd parts are controllable by the plurality of switches; and the even and odd parts are distinguished and interchangeable with each other. One of the matching capacitors ($C_{ho}$ or $C_{he}$) in the ping-pong capacitor arrays is charged one clock cycle before the exponential phase as a preparation for the exponential phase.

In accordance with a further aspect of the present disclosure, the linear phase is activated for suppressing a thermal noise. In particular, the clock cycles distribution between the linear phase and the exponential phase can be selected from 244/12, 245/11, 246/10, 247/9, and 248/8, when the linear-exponential incremental analog-to-digital converter has an oversampling ratio (OSR) of 256 clock cycles.

In accordance with a further aspect of the present disclosure, the output of the analog modulator is coupled to the DWA circuit and an output of the DWA circuit is further coupled to the DAC, forming a feedback path.

In accordance with a further aspect of the present disclosure, the quantizer is a 17-level quantizer for reducing swings of an op-amp for the integrator. The quantizer can be configured to have a reference scaled down by half.

In accordance with a further aspect of the present disclosure, the analog input voltage is first coupled to a bootstrapped switch, wherein the bootstrapped switch is configured to enable at a delayed clock cycle for charging a sampling capacitor ($C_{DAC}$). The $C_{DAC}$ is electrically connected to a negative input terminal of the first integrator when the bootstrapped switch is disabled, and has a capacitance matched with a capacitance of the capacitor ($C_F$) in the first integrator.

In accordance with a further aspect of the present disclosure, the analog modulator is configured to operate with a low-distortion feedforward structure with a feedforward capacitor for coupling the analog input voltage to an input of the adder when the first integrator is reset.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF THE DRAWINGS

The appended drawings, where like reference numerals refer to identical or functionally similar elements, contain figures of certain embodiments to further illustrate and clarify various aspects, advantages and features of the incremental analog-to-digital converter as disclosed herein. It will be appreciated that these drawings and graphs depict only certain embodiments of the invention and are not intended to limit its scope. The incremental analog-to-digital converter as disclosed herein will be described and explained with additional specificity and detail through the use of the accompanying drawings in which.

Skilled artisans will appreciate that elements in the figures are illustrated for simplicity and clarity and have not necessarily been depicted to scale.

DETAILED DESCRIPTION

The present disclosure generally relates to an incremental analog-to-digital converter (IADC). More specifically, but without limitation, the present disclosure relates to an IADC with a two-phase linear-exponential accumulation loop for improving the signal to noise distortion ratio (SNDR) and the dynamic range (DR). The incremental converter operates as a first-order IADC in the first phase to accumulate the signal linearly and suppress the thermal noise preferably for 246 cycles, and then the incremental converter enables a noise coupling (NC) path to boost exponentially the signal-to-quantization-noise ratio (SQNR) in the second phase preferably for 10 cycles.

Furthermore, the uniform-exponential weighting allows the data weighted averaging (DWA) to work well to average the element mismatch error of the feedback DAC. Thus, by employing a 17-level quantizer the swings of the op-amps can be reduced. The proposed single-loop two-phase exponential accumulation sequence combines the benefits of the thermal noise and the DAC mismatches suppression from the first-order linear phase and the SQNR boosting capability in the subsequent exponential accumulation phase.

The following detailed description, the IADC is merely exemplary in nature and is not intended to limit the disclosure or its application and/or uses. It should be appreciated that a vast number of variations exist. The detailed description will enable those of ordinary skill in the art to implement an exemplary embodiment of the present disclosure without undue experimentation, and it is understood that various changes or modifications may be made in the function and arrangement of the IADC described in the exemplary embodiment without departing from the scope of the present disclosure as set forth in the appended claims.

In the traditional single-loop IADCs, the loop consists of one integrator or a plurality of cascading integrators. Thus, the signal is accumulated linearly to bi-quadratically with increasing clock cycles per conversion (or OSR), from first-order to fourth-order IADCs, respectively. However, an exponential integrator offers a faster accumulation, achieving the resolution in a fewer number of clock cycles.

A. EXPONENTIAL INCREMENTAL ADC

Figure 1A:
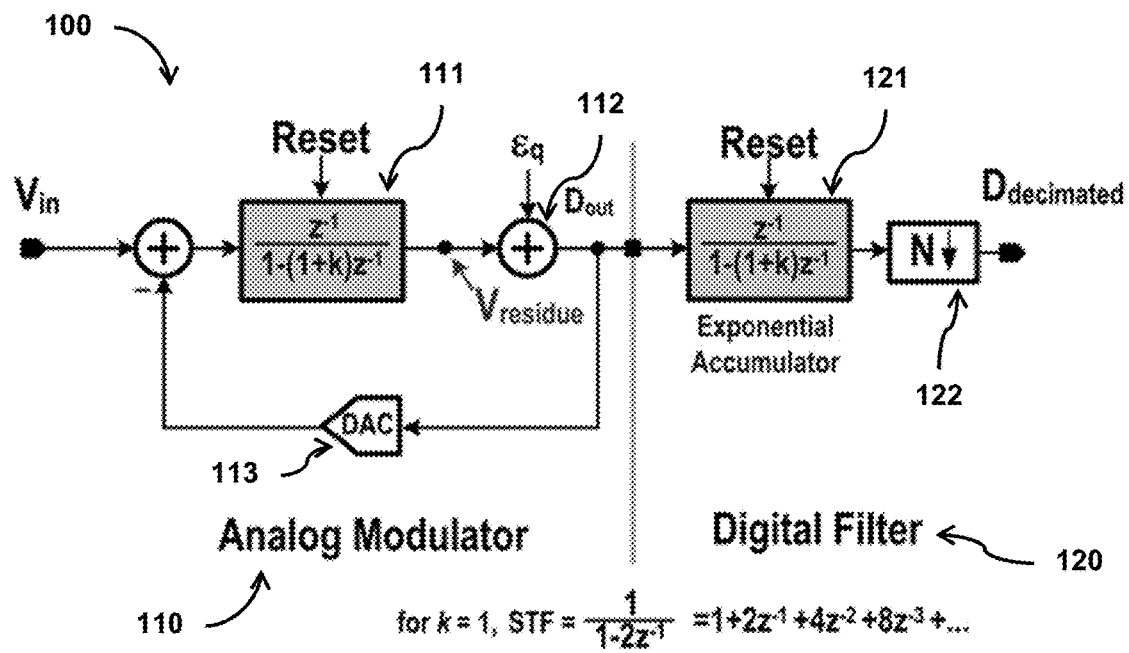
FIG. 1A depicts a conceptual diagram of an exponential IADC.

Referring to FIG. 1A, a conceptual diagram of a typical exponential IADC 100 is depicted. The exponential IADC 100 comprises an analog modulator 110 and a decimation filter (or called digital filter) 120. The transfer function of the IADC is an exponential type, where $k_e$ is a coefficient related to the speed of accumulation. The exponential IADC 100 receives an analog input signal ($V_{in}$) and connects the analog signal $V_{in}$ to an integrator 111. The integrator 111 includes at least an op-amp and a capacitor coupled in parallel with the integrator 111. The output terminal of the integrator 111 is connected to an adder 112 to obtain a digital output signal ($D_{out}$). The DAC 113 provides a feedback path, which outputs an analog signal according to a logic value of the $D_{out}$.

The digital output signal is coupled to a decimation filter 120 comprising an exponential accumulator 121 and a digital decimator 122. The exponential accumulator 121 can be a digital integrator, and the output of the exponential accumulator 121 is coupled to the input of the digital decimator 122. The exponential accumulator 121 may include digital adder such that the digital output signal ($D_{out}$) provided at the input is accumulated in each cycle. A "Reset" signal is provided to respective reset inputs of the integrator 111 and the exponential accumulator 121. When "Reset" is enabled (active high), the output of each of the integrator 111 and the exponential accumulator 121 is zero.

Figure 1B:
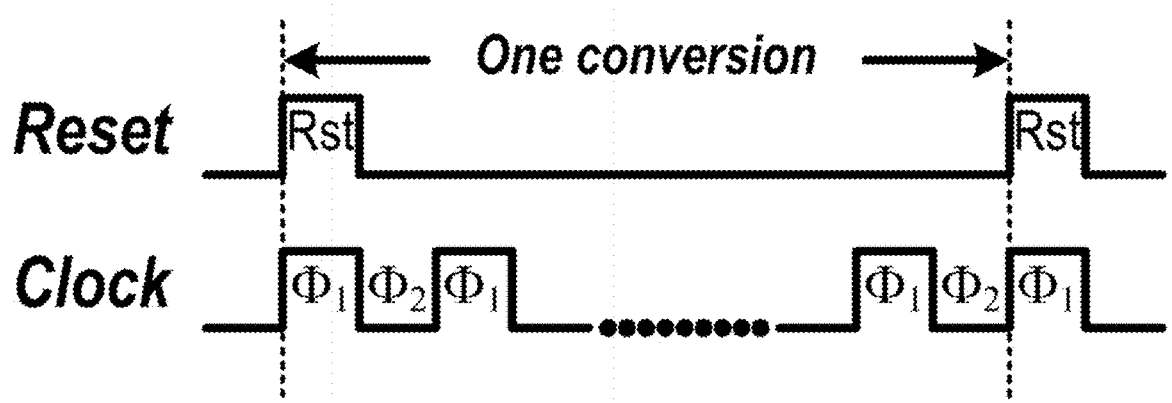
FIG. 1B depicts a timing diagram of the exponential IADC of FIG. 1A.

From the timing diagram, as shown in FIG. 1B, after the reset operation both the analog modulator 110 and the decimation filter 120 accumulate from zero until the activation of the next reset. In the analog domain, the loop accumulates the difference between the analog input signal ($V_{in}$) and the tracking DAC. In the digital domain, the filter accumulates the bit stream, and the feedback DAC represents the bit-stream information. At the end of one conversion cycle with N clock cycles, the exponential integrator output can be expressed as follow:

$$V_r(N) = \Sigma_{i=1}^{N}[(V_{in}[i] - D_{out}[i]V_{refm}) \times W(i)] \quad (1)$$

wherein:
L is the number of levels in the quantizer;
$V_{FS}$ is the full-scale reference;

$$V_{refm} = V_{FS}/(L-1); \quad (2)$$

$$D_{out}[i] \varepsilon [0, L-1]; \text{ and} \quad (3)$$

$$W(i) = (1+k_e)^{N-1}. \quad (4)$$

The factor W(i) in Equation (4) represents the weights of the signal during the accumulation process. This weight is a sample variant in the exponential IADC, similar to high-order incremental structures. Therefore, the estimation of the average analog input signal ($V_{in}$) can be described as follow:

$$\overline{V}_{in} = \frac{\sum_{i=1}^{N} D_{out}[i] V_{refm} W(i)}{M} + \frac{V_r(N)}{M} \quad (5)$$

wherein:
M is the input gain of the signal (i.e., the sum of the signal weights during the accumulation process); and $$M = \Sigma_{i=1}^{N} W(i). \quad (6)$$

The feedback DAC tracks the input signal, thus $V_{refm}$ bounds the integrator. Therefore, the $V_r(N)$ represents the residue voltage and the decimation filter output ($D_{dec}$) can be regarded as the digitization of the input signal. The theoretical resolution is:

$$R = \log_2[M(L-1)] \approx \log_2\left(\frac{(1+k_e)^N}{k_e}\right) + \log_2(L-1). \quad (7)$$

Therefore, the resolution of the exponential IADC depends on the OSR, the coefficient $k_e$ and the quantizer level. The larger the coefficient $k_e$, the larger the accumulation slope is. A multi-bit quantizer can enhance the resolution by reducing the residue voltage boundary.

Figure 2:
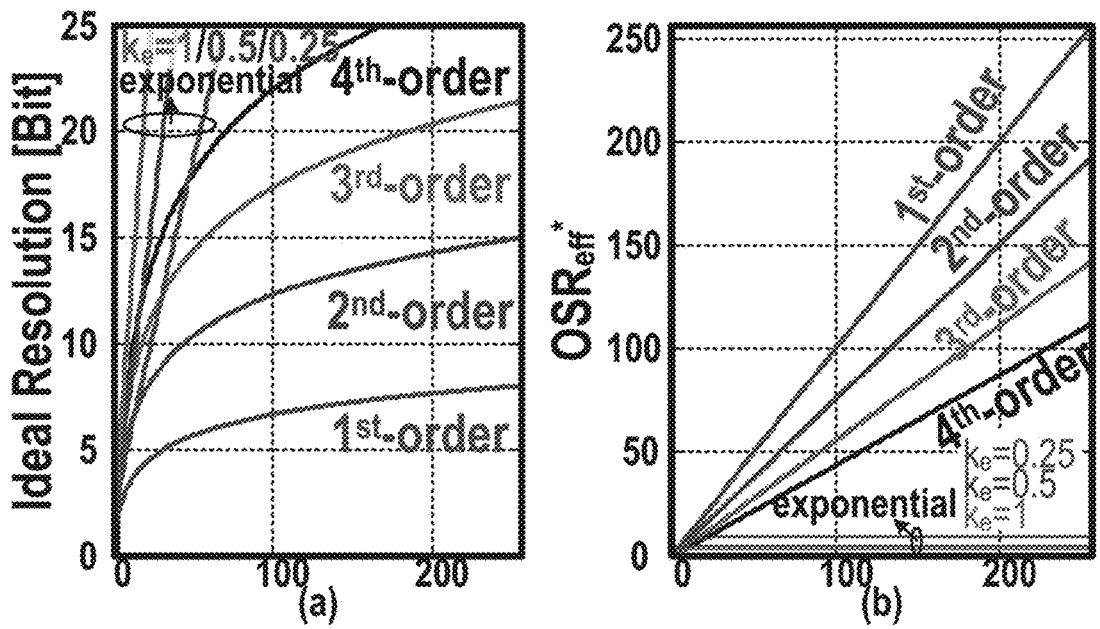
FIG. 2 depicts two graphs showing (a) the theoretical resolution of an exponential IADC and traditional order-based IADCs versus OSR (or N); and (b) the $OSR_{eff}$ (the effective OSR for thermal noise reduction) of the exponential IADC and the traditional IADCs versus OSR.

Assuming that the quantizer is a two-level quantizer, FIG. 2 graph (a) demonstrates the relationship between resolution versus the coefficient $k_e$ and the OSR (or N). When compared with the traditional IADCs, the proposed scheme digitizes the signal in a faster way. Considering an SQNR of 120 dB, the theoretical required clock cycles are 1449/186/73 from second to fourth order. However, the required clock cycles for the exponential scheme are 55/32/20 periods (with $k_e$=0.25/0.5/1). Then, the proposed scheme can achieve high resolution with a fewer clock cycles, especially when we choose a large coefficient k.

Apart from the SQNR, thermal noise is another fundamental limiting factor that must be carefully considered in high-resolution ADCs. The same type of concern holds for the utilization of the DWA technique in case of using a multi-bit DAC.

With the oversampling operation, the input-referred thermal noise can be ideally suppressed by OSR (i.e., the number of clock cycles N) by the following equation:

$$V_{n,input\_uniform}^2 = \frac{2kT}{C_s} \frac{1}{N}. \qquad (8)$$

However, as shown in FIG. 2 graph (b), high-order IADCs have a thermal noise penalty due to the non-uniform weights in the signal accumulation, i.e., the $OSR_{eff}$ (the effective OSR for thermal noise reduction) will be reduced. The monotonic decreasing weighting in traditional high-order IADCs results in a thermal noise penalty. The input-referred noise of such converter could be calculated with the sum of the squared weightings divided by the square of the weighting's sum:

$$V_{n,input\_non\_uniform}^2 = \frac{V_{n,total}^2}{M^2} = \frac{2kT}{C_s} \frac{\sum_{i=1}^{N} W(i)^2}{\left[\sum_{i=1}^{N} W(i)\right]^2} \qquad (9)$$

wherein:
$V_{n,total}^2$ is the total output noise;
M is the total gain of the input-signal accumulation from Equation (6); and
W(i) is the weights from Equation (4).

For higher loop orders, the thermal noise penalty will also be higher, because of the faster accumulation slope. The penalty factor can be expressed by dividing Equation (9) by Equation (8) to obtain the following result:

$$\text{Penalty Factor} = N \frac{\sum_{i=1}^{N} W(i)^2}{\left[\sum_{i=1}^{N} W(i)\right]^2}. \qquad (10)$$

Table I below shows the penalty factors for second to fourth order (when N is sufficiently large), which are 1.3, 1.8, and 2.3 respectively. The situation is worsening in the exponential case. For example, at an OSR=256, the $OSR_{eff}$ is also 256 for a first-order IADC, thereby the full benefit of oversampling is retained. However, as shown in FIG. 2 graph (b), the $OSR_{eff}$ for second to fourth order and exponential case ($k_e$=1) are decreased by 23%, 57%, and 99% respectively.

TABLE I

| Architecture comparison of various types of IADCs with the present disclosed Linear-Exponential IAC | | | | | | |
|---|---|---|---|---|---|---|
| | $1^{st}$-order | $2^{nd}$-order | $3^{rd}$-order | $4^{th}$-order | Exp ($k_e$ = 1/0.5/0.25) | Proposed Linear-Exp ($k_e$ = 1) |
| Resolution ($\log_2$) | $\binom{N_1}{1}$ | $\binom{N_2}{2}$ | $\binom{N_3}{3}$ | $\binom{N_4}{4}$ | $\Sigma_{i=1}^{N}(1+k_e)^{N-i}$ | $(N_i + 1) * 2^{(N_s+1)}$ |
| N (or OSR) for 20b Resolution | $N_1$ = 1048576 | $N_2$ = 1449 | $N_3$ = 186 | $N_4$ = 73 | $N_E$ = 20/32/55 | N = 256 (246 $1^{st}$ order + 10 Exp) |
| Input referred kT/C noise | $\frac{1}{N_1}\left(\frac{2kT}{C_s}\right)$ | $\frac{1.3}{N_2}\left(\frac{2kT}{C_s}\right)$ | $\frac{1.8}{N_3}\left(\frac{2kT}{C_s}\right)$ | $\frac{2.3}{N_4}\left(\frac{2kT}{C_s}\right)$ | $\frac{1}{3/5/9}\left(\frac{2kT}{C_s}\right)$ | $\frac{1.03}{N}\left(\frac{2kT}{C_s}\right)$ |
| Multi-bit DAC + DWA | ✓ | x | xx | xxx | xxxx | ✓ |
| STF's Notches | Yes | No | No | No | No | Yes |

The sample-variant weighting property affects the input referred thermal noise for a given sampling capacitor Cs in the exponential scheme. From the Equation (11) below, the input-referred kT/C noise is no longer related to the OSR anymore, but only to the coefficient $k_e$:

$$V_{n,input}^2 = \frac{2kT}{C_s} \frac{1}{1+\frac{2}{k_e}}. \qquad (11)$$

As FIG. 2 graph (b) intuitively highlights, Equation (11) indicates that with the increasing of clock cycles per conversion, the benefit of thermal noise reduction is not growing with the OSR. From Table I as well, the advantage of oversampling did not appear in Equation (11). The principal reason is that the weightings, like the traditional high-order IADCs, are non-uniform. Regrettably, the situation in the exponential scheme is worsening because the weighting decreases exponentially rather than gradually like in conventional high-order IADCs.

High-resolution IADCs that use multi-bit quantizers require advanced dynamic element matching (DEM) techniques to guarantee the targeted linearity. Nevertheless, Table I shows that the non-uniform weights in high-order and exponential IADCs lead to the same treatment of the DEM weighting like in the discussion of the thermal noise suppression before, namely, the penalty trends still apply similar to the DEM effectiveness. For example, Liu et. al. [3] used a smart DEM for a second-order IADC, but the implementation is relatively complicated.

B. LINEAR-EXPONENTIAL INCREMENTAL ADC

As demonstrated in Section A, the penalty of oversampling on the thermal noise is that the weightings of both the high order and exponential IADCs are non-uniform. The first-order IADC provides a uniform weighting function but suffers from a long-conversion time, whereas the exponential IADC offers faster accumulation but suffers from the penalty of an input-referred thermal noise. Therefore, there is a need for an IADC with a new architecture that has the advantages and avoids the disadvantages of the first-order IADC and the high-order/exponential IADC.

Figure 3A:
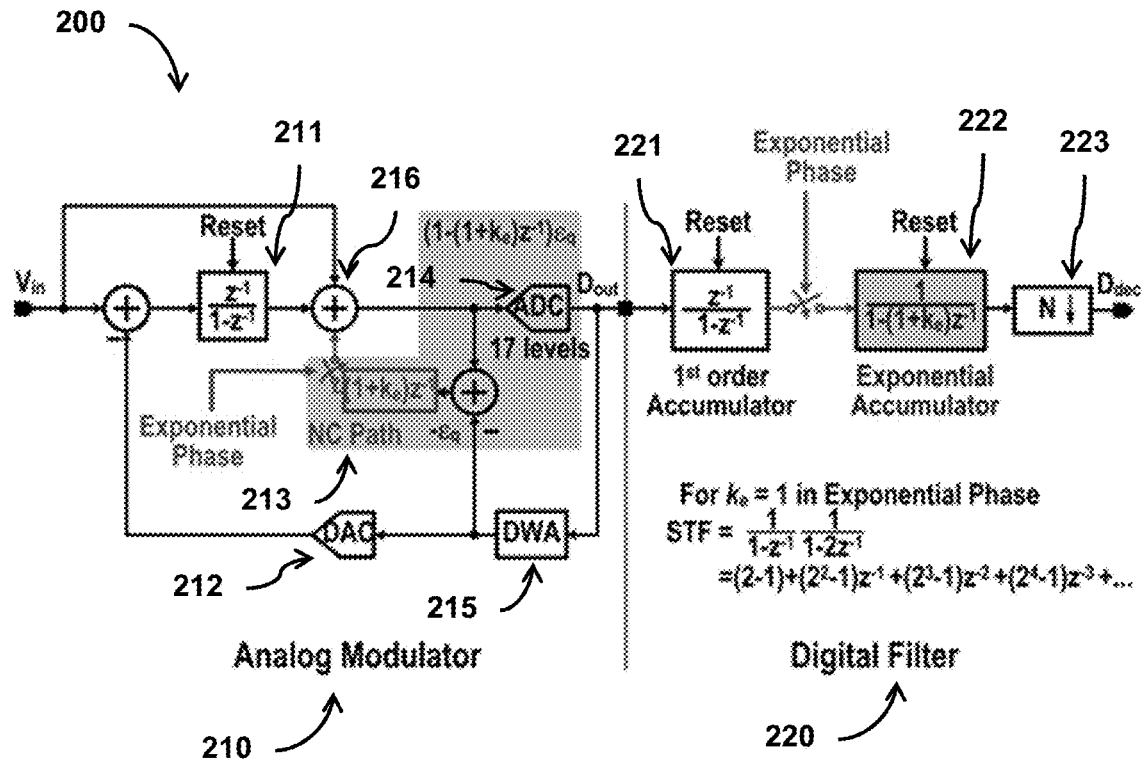
FIG. 3A depicts a conceptual diagram of a linear-exponential IADC in accordance with an exemplary embodiment of the present disclosure.
Figure 3B:
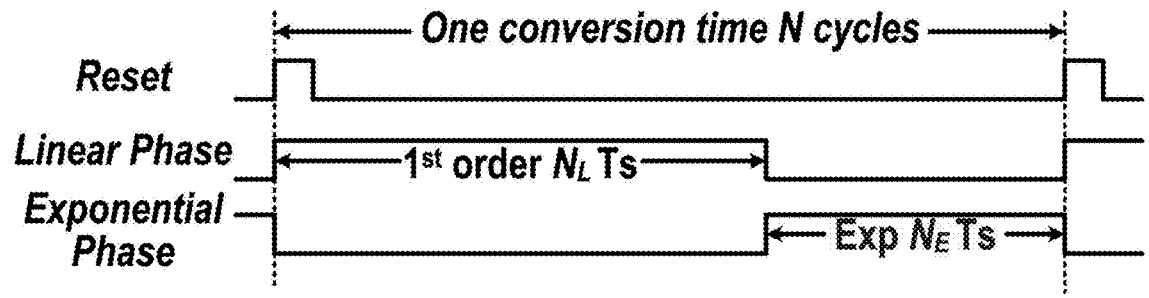
FIG. 3B depicts a timing diagram of the linear-exponential IADC of FIG. 3A.

With reference to FIG. 3A, a linear-exponential IADC 200 in accordance with an exemplary embodiment of the present disclosure is provided. The linear-exponential IADC 200, having a two-phase architecture, comprises an analog modulator 210 and a decimation filter (or called digital filter) 220. The analog modulator 210 comprises a first integrator 211, an adder 216, a quantizer 214, a noise-coupling (NC) path 213, a DWA circuit 215, a DAC 212 and one or more switches. The analog modulator 210 is structured by cascading the first integrator 211, the adder 216, and the quantizer 214 with feedback paths formed by the DWA circuit 215, the DAC 212, and the NC path 213. The decimation filter 220 has an input for receiving signals from the output of the analog modulator, which comprises a $1^{st}$ order accumulator 221, an exponential accumulator 222, a digital decimator 223, and one or more switches. The exponential accumulator 222 can be a digital integrator and the output of the exponential accumulator 222 is coupled to the input of the digital decimator 223. The $1^{st}$ order accumulator 221 is a digital integrator with a mapped function as the first integrator 211 (the analog integrator). During the exponential phase, the exponential accumulator 222 collects data from the output of the $1^{st}$ order accumulator 221 and accumulates the collected data in each clock cycle for generating the decimation filter output ($D_{dec}$). The transfer function of the exponential accumulator 222 is:

$$\left(\frac{1}{1-(1+k_e)z^{-1}}\right). \quad (12)$$

The linear-exponential IADC 200 receives an analog input signal ($V_{in}$) and connects the analog signal $V_{in}$ to a first integrator 211. The first integrator 211 is resettable and the transfer function is:

$$\left(\frac{z^{-1}}{1-z^{-1}}\right) \quad (13)$$

Generally, an integrator may be any system, device, or apparatus configured to convert a sum of signals received at the negative input terminal of the integrator to an output signal indicative of an integral, with respect to time, of the sum of the signals received. The first integrator 211, the adder 216, and the quantizer 214 are arranged in a cascade configuration to obtain a digital output signal ($D_{out}$). The DAC 212 provides a feedback path, which outputs an analog signal according to a logic value of the $D_{out}$. In the feedback path, there is provided a DWA circuit 215 for diminishing the impact of DAC 212 mismatch errors.

The quantizer 214 may be any system, device, or apparatus configured to receive an analog signal and convert such analog signal to a multi-bit digital signal. Therefore, the quantizer 214 can be realized as an ADC, and the digital signal may be output by the ADC.

The linear-exponential IADC 200 resolves the thermal noise limitation in conventional exponential IADCs, by periodically deactivating the exponential accumulator 222 at the beginning of the conversion. In the analog modulator 210, the linear-exponential IADC 200 has one integrator only at the beginning of the linear phase 331, and operates as a first-order structure for equal weights of 246 cycles. The oversampling contributes to the reduction of thermal noise. In the exponential phase 332, the NC path 213 and the exponential accumulator 222 are activated for creating an exponentially accumulating loop for the remaining 10 cycles.

The number of clock cycles 334 for operating as a first-order structure and activating the NC path 213 can be otherwise, as would be apparent to those skilled in the art. The clock cycles distribution is based on the expected performance, and the consideration is based on a tradeoff between the input referred thermal noise (determined by the linear phase 331) and the SQNR (determined by the exponential phase 332). Linear phase 331 and exponential phase 332 distributions of 244/12, 245/11, 246/10, 247/9, and 248/8 do not make an obvious difference with respect to the overall power and resolution performance of the linear-exponential IADC 200. Generally, significantly more clock cycles for the linear phase 331 is more advantageous, which can achieve enough margin (>12 dB) on SQNR without unduly limiting the performance on the kT/C noise.

The overall signal transfer function is:

$$\left(\frac{z^{-1}}{1-z^{-1}}\right)\left(\frac{1}{1-(1+k_e)z^{-1}}\right) \quad (14)$$

The first-order term can increase the final SQNR. However, this does not affect too much the exponential accumulation since the first-order term is too weak when compared with the exponential term. Thus, the linear-exponential accumulation scheme in the linear-exponential IADC 200 works complementarily by combining the advantages of thermal noise suppression and SQNR boosting.

Figure 4:
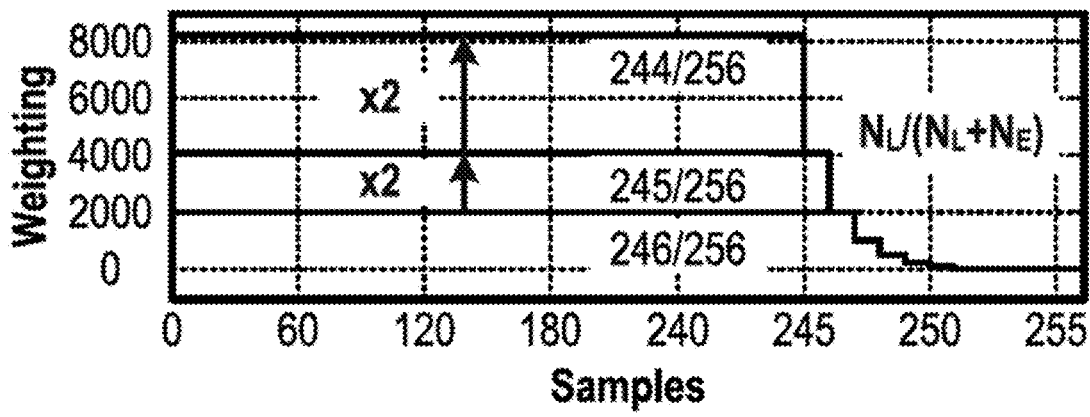
FIG. 4 depicts a plot showing the weighting function of the linear-exponential IADC of FIG. 3A with $k_e=1$ (normalized from the last sample).

FIG. 4 plots the weighting function of a linear-exponential IADC 200 where the linear phase 331 offers a uniform weighting function. The linear-exponential IADC 200 allows the DWA technique to work well in averaging the mismatch error. The weightings at the exponential phase 332 are not identical but they are much less significant as they are decreasing exponentially and are much lower than the weights in the linear phase 331.

Considering the speed of loop accumulation, analog matching, and the complexity of the decimation filter, the coefficient $k_e=1$ is selected. The coefficient $k_e$ has an impact on the maximum stable amplitude (MSA), because of the feed back quantization noise. Fortunately, the stable input range would be benefited from the increase of the quantizer bit, which will be analyzed next.

A small OSR would lead to a large sampling capacitor in a high-resolution ADC. In the present disclosure, an OSR of 256 is used to achieve low cost in terms of area, with an input sampling capacitance Cs of 8 pF. As shown FIG. 4, for the 256 clock cycles, the more clock periods allocated in the exponential phase 332, the larger the weighting will be in the linear phase 331. However, the thermal noise benefits will diminish. Generally, the following equations describe the weighting function:

$$W(i) = \begin{cases} 2^{N_E+1} - 1, i \in [1, N_L] \\ 2^{N-i+1} - 1, i \in [N_L + 1, N] \end{cases} \quad (15)$$

$$N = N_L + N_E \quad (16)$$

wherein:
$N_L$ is the number of clock cycles for the linear phase;
$N_E$ is the number of clock cycles for the exponential phase; and
N is the total number of clock cycles per conversion.

The input-referred noise of the linear-exponential IADC 200 can be written as follows:

$$V_{n,input}^2 = \frac{V_{n,total}^2}{M_{input,linear-exp}^2} = \frac{2kT}{C_s} \frac{\sum_{i=1}^{N} W(i)^2}{\left[\sum_{i=1}^{N} W(i)\right]^2}. \quad (17)$$

Figure 5A:
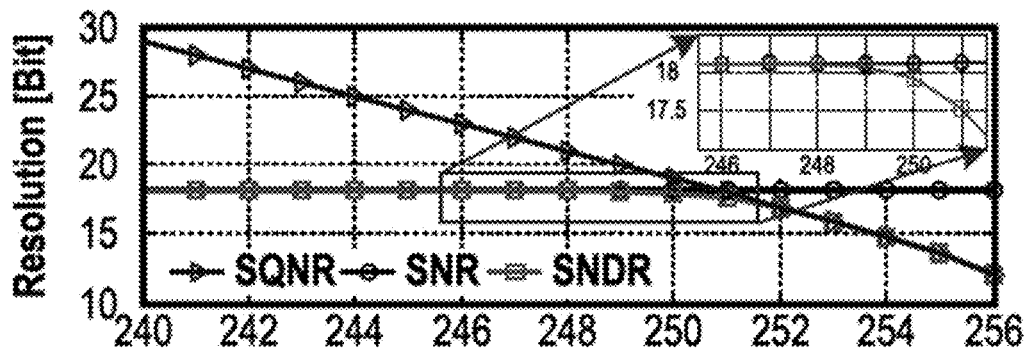
FIG. 5A depicts a plot showing the resolution versus the number of clock cycles of the linear phase in the linear-exponential IADC of FIG. 3A.
Figure 5B:
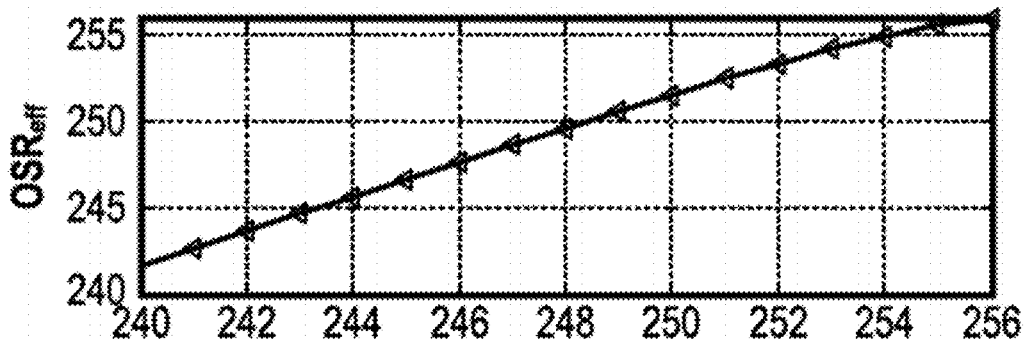
FIG. 5B depicts a plot showing the equivalent OSR for thermal noise suppression versus the number of clock cycles of the linear phase in the linear-exponential IADC of FIG. 3A.

The summation of the weighting in an IADC during one conversion represents the theoretical resolution. Therefore, the disclosed linear-exponential IADC 200 can achieve a higher SQNR by optimizing the number of clock cycles in the linear phase 331 and the exponential phase 332 respectively. However, having more periods allocated for the second phase means that the $OSR_{eff}$ for thermal noise is smaller. As shown in FIG. 5A and FIG. 5B, the relationship between the resolution and the overall $OSR_{eff}$ for the linear-exponential IADC 200 versus $N_L$ with a 17-level quantizer is depicted. To allow a sufficient margin in the kT/C noise of 110 dB and other circuit non-idealities, a clock cycle of $N_L=246$ is selected for the linear phase 331, while the remaining 10 periods are the exponential phase $N_e$ 332. It would be apparent to those skilled in the art that the clock cycles distribution is not absolute and the number of periods is merely exemplary. The thermal noise penalty factor is around 1.03, which is very close to a first-order IADC from Table I. The clock cycles distribution implies a good tradeoff between the SQNR and the kT/C noise.

The NC path 213 feeds the quantizer noise back to the input node of the quantizer 214, which increases the swing at the input of quantizer 214, and reduces the MSA of the linear-exponential IADC 200. By employing a quantizer 214, a stable input swing can be maintained and the stability of the linear-exponential IADC 200 can be achieved. Preferably, the multi-bit quantizer 214 is used to relax the specifications of the op-amps for reducing power consumption. For a M-step quantizer 214, the sufficient (but not necessary) input range for MSA can be estimated as follow:

$$|u|_{max} = M + 2 - \underbrace{\sum_{k=0}^{\infty} |h(k)|}_{\Delta \|h\|_1} \quad (18)$$

$$NTF = \begin{cases} (1 - z^{-1}); & \text{linear phase} \\ (1 - z^{-1})(1 - 2z^{-1}); & \text{exp. phase} \end{cases} \quad (19)$$

wherein:
h(k) is the impulse response of the noise transfer function;
$\|h\|_1$ represents the 1-norm of h(n); and
Noise Transfer function (NTF) serve the purpose of discussion on MSA, and does not mean that the converter has noise-shaping property.

In accordance with the Equation (18) and Equation (19), the exponential phase 332 limits the MSA with the corresponding coefficient $k_e$.

Additional levels in the quantizer 214 are beneficial for enlarging the MSA and reducing the swing of the first integrator 211. Meanwhile, it allows the choice of a large coefficient $k_e$, but leads to higher quantizer's power consumption, area, and DWA complexity. Considering these tradeoffs, quantizer 214 is implemented with 17 levels to strike a balance. It would be apparent to one skilled in the art that the quantizer 214 may be implemented with more or fewer levels.

Figure 6:
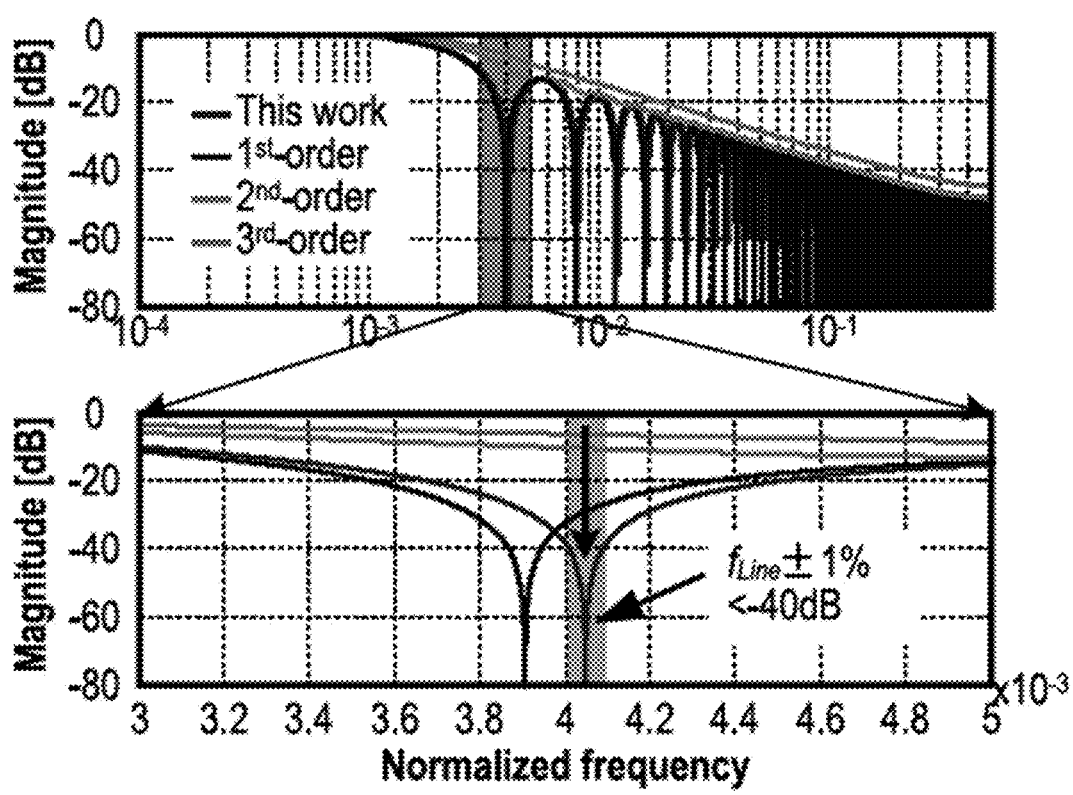
FIG. 6 depicts a plot showing the magnitude frequency response of the decimation filter of the linear-exponential IADC of FIG. 3A.

For the decimation filter 120, conventional IADCs exhibit simple structure, either counter or cascade counters. For a first-order IADC, the counter inherently provides notches as shown in FIG. 6, which can be used to suppress the interferers' noise, such as the line frequency noise. However, the decimation filter 120 of a high-order IADC destroys the advantages due to the non-symmetrical weighting function.

For the linear-exponential IADC 200, the decimation filter 220 is configured directly from the weights from Equation (15), with the magnitude-frequency response as illustrated in FIG. 6, where notches still exist. The justification for it is the fact that most of the weighing sequence is uniform and the weights at the exponential phase 332 are much smaller and decay exponentially. In the linear-exponential IADC 200, the first notch provides suppression larger than 40 dB with ±1% line frequency ($f_1$) variants. Consequently, by carefully selecting the ratio among the line noise frequency, sampling frequency, and the OSR, the notches can suppress the fundamental line noise and its harmonics.

C. CIRCUIT IMPLEMENTATION

Figure 7:
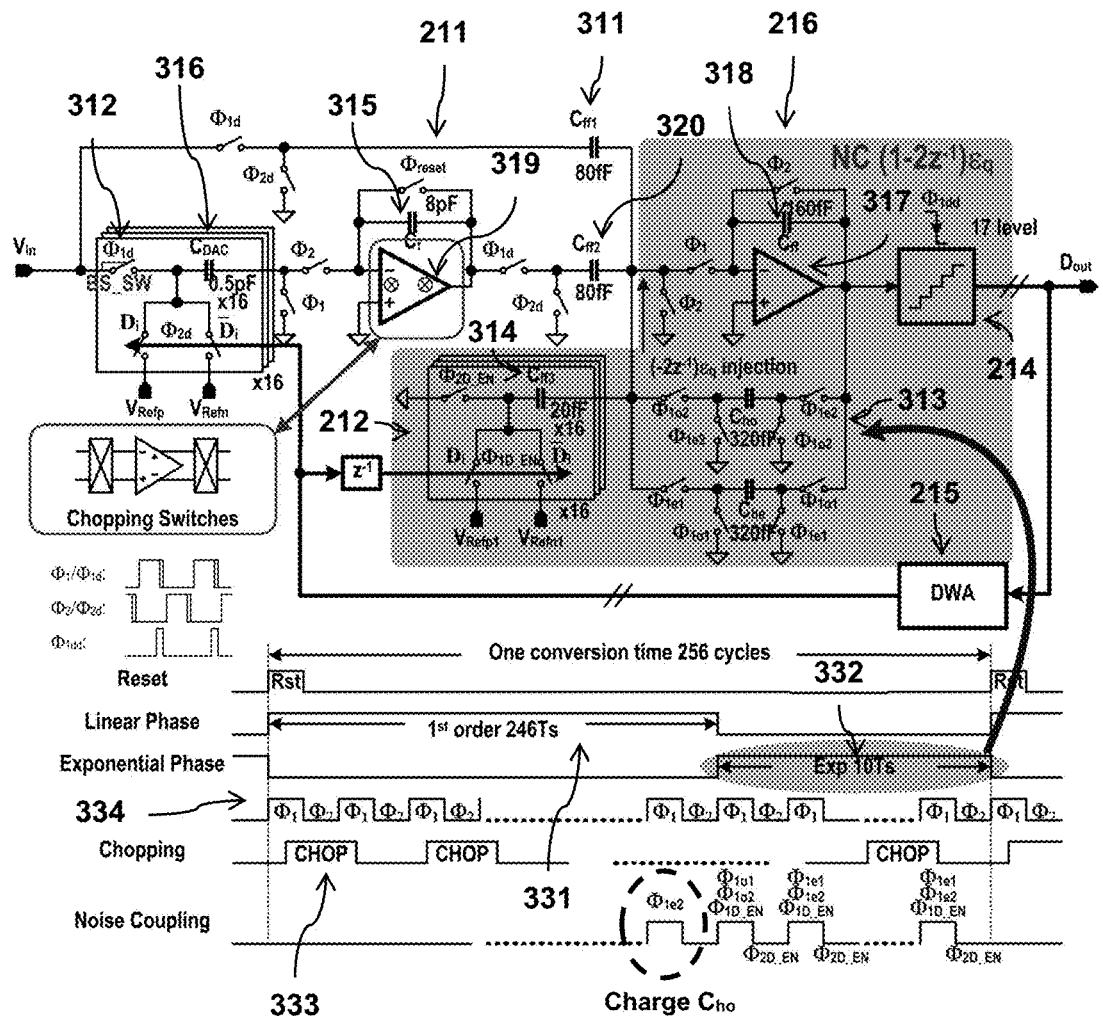
FIG. 7 depicts a circuit diagram of the linear-exponential IADC of FIG. 3A and the respective timing diagram.

Now referring to FIG. 7, the circuit diagram of the linear-exponential IADC 200 is provided. In the circuit diagram, a single-ended implementation is depicted for simplicity, and the preferred implementation is fully differential. In the linear phase 331, the circuit operates as a first-order IADC with a low-distortion feedforward structure with a feedforward capacitor $C_{ff}$ 311. From the feedforward structure, the quantization noise limits the voltage swing of the first integrator 211. The op-amp specification can be relaxed in terms of the slew rate at the initial cycle when compared with the conventional first-order feedback structure. The first integrator 211 is reset at Φ1 in the first cycle as illustrated in the timing diagram of FIG. 7. The Φ1d/Φ2d is a slightly delayed version of the Φ1/Φ2, meanwhile the Φ1dd is the comparator strobe signal. The odd-part feedbacks the input information at Φ1o, while the even-part feedbacks the input information at Φ1e. With the feedforward structure, the feedforward capacitor 311 can couple the analog input voltage to an input of the adder 216 when the first integrator 211 is reset.

The NC path 213 comprises ping-pong capacitor arrays 313 having a pair of matching capacitors $C_{ho}$ and $C_{he}$, and a plurality of switches controllable by Φ1o1, Φ1e1, Φ1o2, and Φ1e2 to separate the ping-pong capacitor arrays 313 into an even part and an odd part. The feedback DAC array 212 comprising a capacitor $C_{ff3}$ 314 and a plurality of switches controllable by $\Phi_{1D\_EN}$, and $\Phi_{2D\_EN}$. When the exponential phase 332 is enabled, the NC path 213 is activated and the DAC 212 starts to operate. The even part of the ping-pong capacitor arrays 313 is enabled a cycle earlier than the odd part to charge the $C_{ho}$ at the last cycle of the linear phase 331, to prepare the input information for the first cycle of the exponential phase 332. The ping-pong capacitor arrays 313 operate in a ping-pong fashion such that for each Φ1 enabled clock cycle, the Φ1o1, $C_{he}$ path and the Φ1e2, $C_{ho}$ path are enabled alternatively. Therefore, the matching capacitors $C_{ho}$ and $C_{he}$ are charged at alternating clock cycles. The even and odd parts are distinguished for description, and the even and odd parts are interchangeable with each other.

As the linear phase and the exponential phase are activated for a plurality of clock cycles 334 in accordance with the clock cycles distribution. During the linear phase, the first integrator 211, the adder 216, and the quantizer 214 are activated to accumulate the signal linearly. During the exponential phase, the NC path 213 and the decimation filter 220 are activated to boost exponentially the SQNR.

In the illustrated embodiment, an analog input voltage ($V_{in}$) is provided via an input node to a bootstrapped switch BS_SW 312, which is used to ensure the linearity of the critical input switches. The present disclosure uses a bottom-plate sampling to reduce the signal-dependent charge injection. The bootstrapped switch BS_SW 312 is enabled by a delayed clock cycle Φ1d for charging the sampling capacitor $C_{DAC}$ 316 with $V_{in}$. In the Φ2d phase, the bootstrapped switch BS_SW 312 is disabled and the $C_{DAC}$ 316 is electrically connected to the first integrator 211 at the negative input terminal of the first op-amp 319. A capacitor 315 is coupled between the negative input terminal and the output terminal of the first op-amp 319. Considering the flickering noise and offset, a chopping technique is implemented in the first integrator 211. The non-overlapping chopping clock 333 toggles substantially at the middle of Φ1 with the virtual ground chopping switches enabled slightly earlier than the output chopping. The output of the first op-amp 319 is coupled to a switch controllable by Φ1d, and then to one terminal of a capacitor $C_{ff2}$ 320. The other terminal of the capacitor $C_{ff2}$ 320 is connected to an adder 216 via a switch controllable by 1I. The adder 216 is a second op-amp 317, and a capacitor 318 is coupled between the negative input terminal and the output terminal of the second op-amp 317. The output of the second op-amp 317 coupled to ping-pong capacitor arrays 313 and a quantizer 214. The quantizer 214 is configured to be triggered by Φ1dd to obtain a 17-level digital output signal. The digital output signal of the quantizer 214 may be coupled to and communicated with the DWA circuit 215 and the output thereof is coupled to one or more DACs 212 in the feedback circuit.

From the coefficients, the capacitor mismatches influence the transfer function matching between the analog modulator and the digital filter, as well as the DAC linearity. For the transfer function mismatch, two main concerns are the ratios between $C_{DAC}$ 316 (also used as the sampling capacitor) and a capacitor $C_F$ 315, and the ping-pong capacitor arrays 313 in the NC path 213.

For the mismatch between $C_{DAC}$ 316 and $C_F$ 315, the thermal noise determines the size of the $C_{DAC}$ 316. In order to achieve an SNR due to kT/C noise of 110 dB, the total capacitance of the $C_{DAC}$ 316 is 8 pF (0.5 pF×16) with 256 clock cycles, which matches with the capacitance of the capacitor $C_F$ 315. Such size of capacitors can guarantee a sufficient integrator coefficient matching, to eliminate such type of error.

Figure 8A:
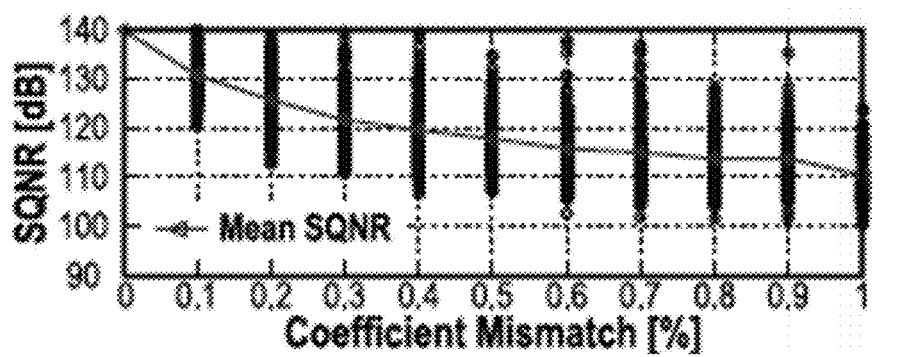
FIG. 8A depicts a plot showing the simulated SQNR of the linear-exponential IADC of FIG. 3A due to mismatch error in the NC network.

For the mismatch in the NC path 213, coefficients mismatch will generate a transfer function mismatch on the quantization noise of $(1-2z^{-1})\varepsilon_q$. As the capacitor ratios represent the coefficients. For each variation of the coefficients, including the coefficient $k_e$, Monte Carlo behavioral simulations are performed with 200 samples per case. From the results in FIG. 8A, the IADC can achieve an SQNR higher than 110 dB with a standard deviation of 0.2%, which is the matching level that can be guaranteed in 65 nm CMOS technology.

Figure 8B:
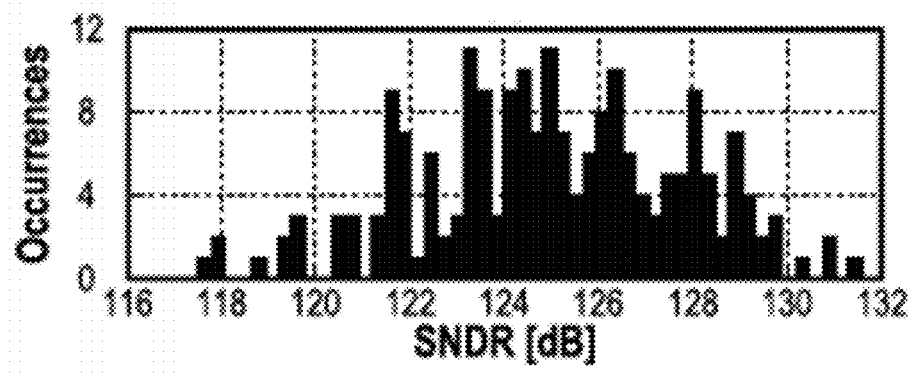
FIG. 8B depicts a plot of the SNDR showing the behavioral simulation after utilizing the DWA technique in the linear-exponential IADC of FIG. 3A.

For the DAC 212 non-linearity caused by element mismatch, there are two sources, the feedback DAC array and the ping-pong capacitor arrays 313 in the NC path 213. To average the mismatch error in the feedback DAC 212, the scheme uses a simple DWA technique. FIG. 8B shows that the behavioral simulation for utilizing the DWA circuit 215 allows a 117 dB signal to noise distortion ratio (SNDR) at least with a unit element σ=0.05% for a sampling DAC 212 unit cell. In one embodiment, the DWA circuit 215 consists of a switch matrix array, a point detector and fewer control logic gate. Moreover, 16-quadrant random walk and the common-centroid layout techniques are adopted to guarantee a high matching accuracy. When observing the ping-pong capacitor arrays 313, the gain of the linear phase 331 relaxes the matching requirement. The behavioral model shows that the SNDR is above 120 dB under the error of σ=0.2% for a DAC 212 unit element in the ping-pong capacitor arrays 313 in the NC path 213 without any DEM.

As it is known that capacitor mismatch is one of the major concerns for transfer function errors and often limits the DAC 212 linearity. The foregoing structures and analysis show that the matching requirements for the linear-exponential IADC 200 are not too critical and can be guaranteed with good reliability in the used CMOS process.

The linear-exponential IADC 200 comprises a first op-amp 319 for the first integrator 211, and a second op-amp 317 for the adder 216 connecting between the first op-amp and the quantizer 214. The finite-gain errors of the two op-amps change the transfer function of the first integrator 211, and degrade the SQNR by imposing an integrator gain error and shifting the pole of the first integrator 211. In order to study the gain error tolerance, a behavioral model is built.

Figure 9:
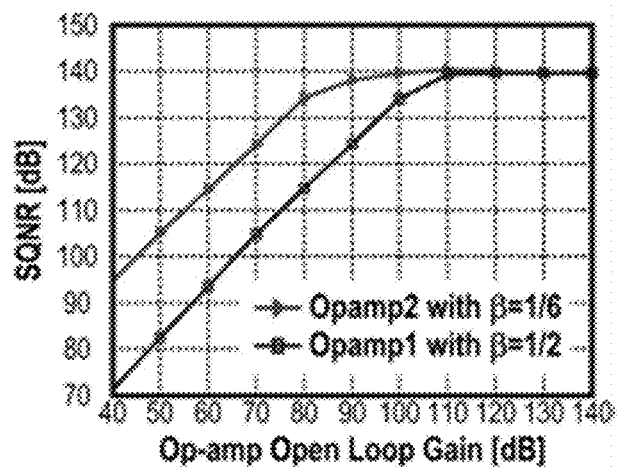
FIG. 9 depicts a plot showing the peak SQNR of the linear-exponential IADC of FIG. 3A with a finite gain of the op-amps.

Referring to FIG. 9, the simulation results of the SQNR versus the open-loop finite gain of the op-amps 319, 317 are provided. For such high-resolution converter, the first op-amp 319 gain requirement of the first integrator 211 is as high as 86 dB for maintaining a SQNR>120 dB. On the other hand, the op-amp requirements of the adder are quite relaxed. The NC transfer function determines the second op-amp 317 specifications (>66 dB), and the input-referred error would be suppressed by the accumulation gain of the linear phase 331.

With the advanced low-voltage nanometer CMOS process, it is difficult to design a high gain op-amp due to the small intrinsic gain of the transistors. However, the first op-amp 319 benefits from the reduced output swing, allowed by the feedforward structure and the multi-bit quantizer 214. Thus, an energy efficient single stage, complementary input, and gain-boosted telescopic op-amp can be utilized under a 1.2V supply.

Figure 10A:
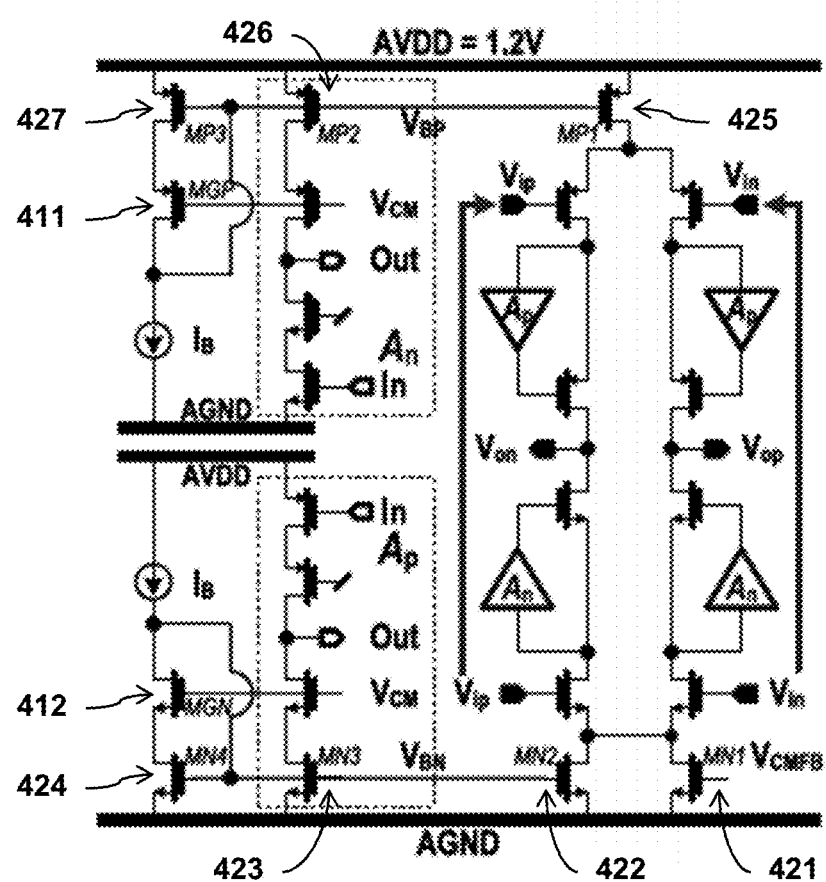
FIG. 10A illustrates an example circuit-level diagram of the first op-amp.

As shown in FIG. 10A, an example circuit-level diagram of the first op-amp 319 is depicted. The circuit can double the transconductance $g_m$ and the open-loop gain with less noise contributing transistors. To guarantee a stable operating point over the process corners, especially in such a low-voltage telescopic topology, the op-amp is biased with the process tracked design. The nominal value of the op-amp virtual ground is around $V_{CM}$. By biasing the transistors MGP 411 and MGN 412 with VCM, an identical $V_{DS}$ of current source transistors MN1 421, MN2 422, MN3 423, MN4 424, MP1 425, MP2 426, and MP3 427, leading to a good current mirroring in such low voltage environment over process variations. Simulation results show that the GBW is about 42 MHz with a deviation of 2% over the MOS process corner variation. Meanwhile, the open-loop gain at the typical corner is 97 dB with a 500-mV Vpp output swing, with the op-amp gain and GBW meeting the requirements over all corners.

Figure 10B:
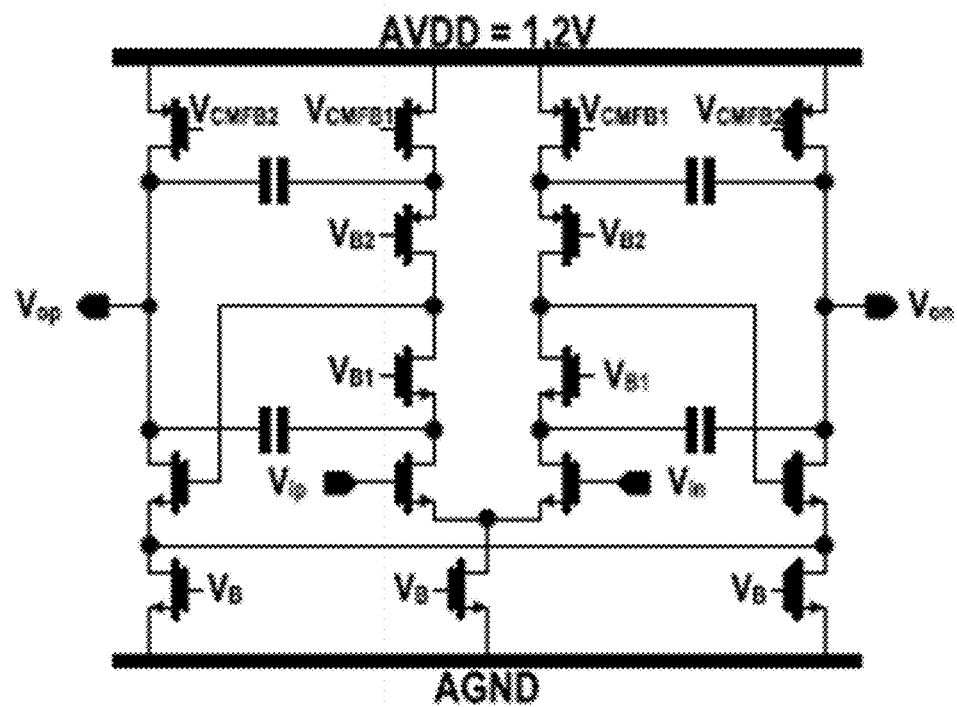
FIG. 10B illustrates an example circuit-level diagram of the second op-amp.

It is known in the art that the gain-scaling technique can be used in modulators to reduce the power consumption because the back-end quantizer has a lower resolution. Therefore, by scaling down the reference of the quantizer 214 by half, the design of the second op-amp 317 can be relaxed because of the small output swing. As shown in FIG. 10B, an example circuit-level diagram of the second op-amp 317 is depicted. The circuit implements a complementary telescopic cascode architecture in the first-stage to guarantee the gain requirement. Simulations show that the open-loop gain is above 70 dB in the maximum swing to ensure the performance.

The reference scaling down technique is achieved by matching the capacitance of $C_{ff2}$ 320 and $C_{ff}$ 318 with a ratio of 1:2. The reference scaling down technique can reduce the quantizer 214 input signal. With reference half-scaled, the requirements on the flash quantizer 214 were almost doubled, but it is not critical in designing the multi-bit quantizer 214. To guarantee the performance of the flash, the comparator consists of a pre-amplifier and a strongARM latch, followed by an SR latch. With the auto-zero technique, the input-referred offset meets the 17-level quantizer 214 requirement.

D. EXPERIMENTAL RESULTS

Figure 11:
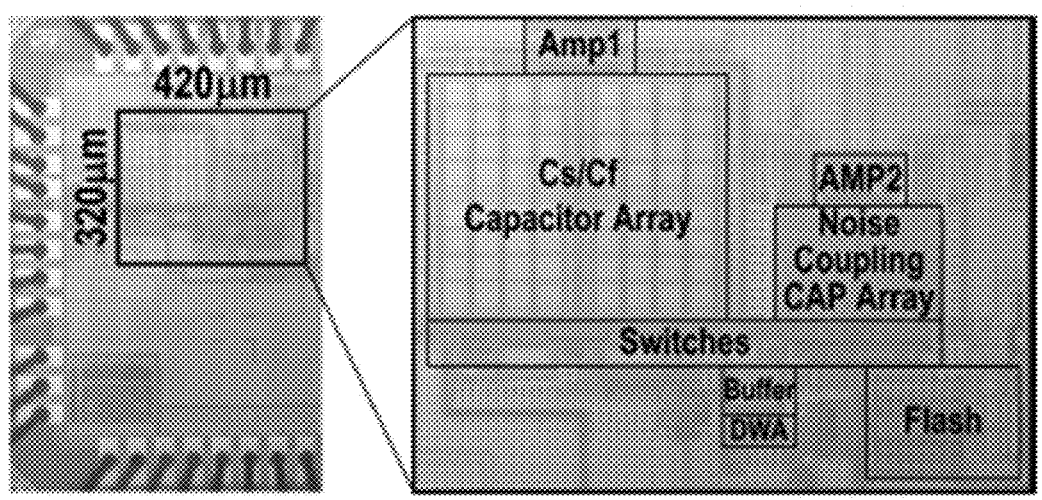
FIG. 11 is an SEM image of a chip micrograph of the linear-exponential IADC.

FIG. 11 exhibits the chip micrograph of the linear-exponential IADC 200 that has been implemented in a 1P7M 65 nm CMOS process, occupying an active area of 0.134 mm² (320 μm×420 μm). Under a 1.2V supply and 10.24 MHz sampling clock, 20 kHz bandwidth (BW), the analog modulator consumes 550 μW (with 48% for the first integrator 211, 33% for the adder, 9% for the digital circuits, 4% for the flash quantizer 214, and the remaining 5% for other components).

Figure 12:
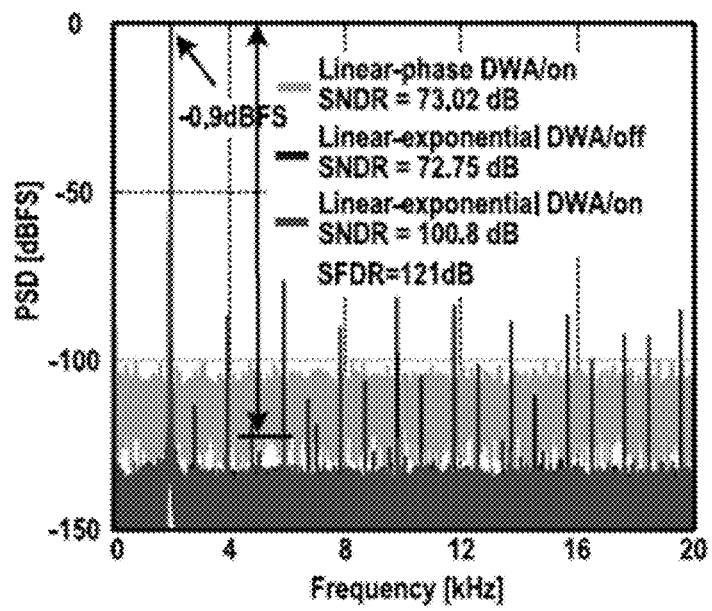
FIG. 12 depicts a plot showing the measured output spectrums of the linear phase IADC with DWA, and the linear-exponential IADC with and without DWA.

FIG. 12 shows the measured output spectrums of the linear phase IADC with DWA circuit 215, and the linear-exponential IADC with and without DWA circuit 215 respectively. The linear phase IADC with DWA circuit 215 shows a measured SNDR of 73.02 dB. The SQNR limits the performance to a 12-bit level with a 246 cycle of linear phase. The SNDR improves to 100.8 dB with the exponential phase 332 enabled in the linear-exponential IADC 200. The effectiveness of the DWA circuit 215 is also demonstrated, which can increase the SNDR by 28.0 dB.

Figure 13:
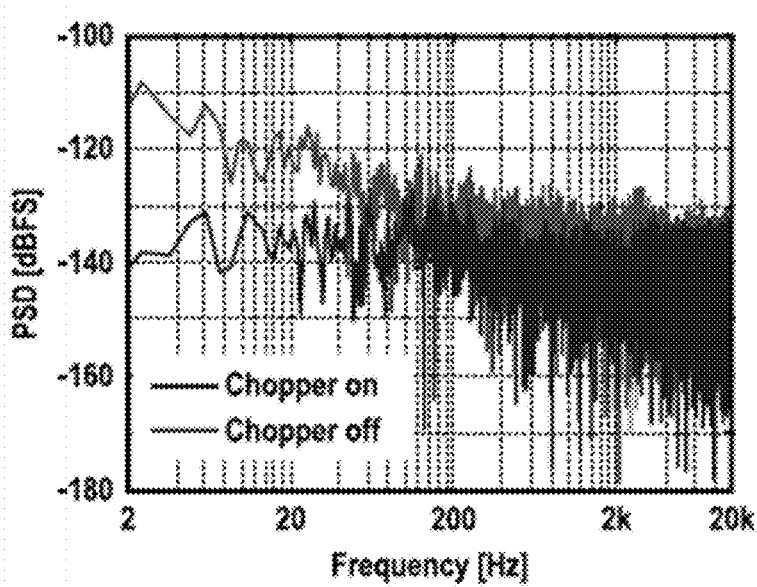
FIG. 13 depicts a plot showing the measured output spectrums of the linear-exponential IADC with and without utilizing the chopping technique.

FIG. 13 shows the measured output spectrums of the linear-exponential IADC with and without utilizing the chopping technique, to demonstrate the improvement on the flicker noise. The chopper modulator improves the SNDR by 5 dB and reduces the offset from 1.27 mV to 72.51 μV.

Figure 14:
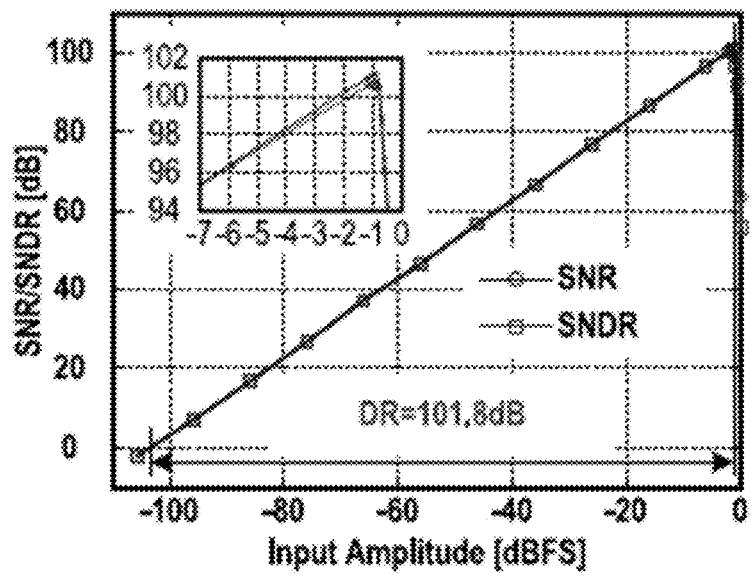
FIG. 14 depicts a plot showing the measured SNR and SNDR versus the input amplitude with DWA enabled.

FIG. 14 reveals the measured IADC's SNR/SNDR versus the input amplitude and the ADC achieves a dynamic range (DR) of 101.8 dB.

Figure 15:
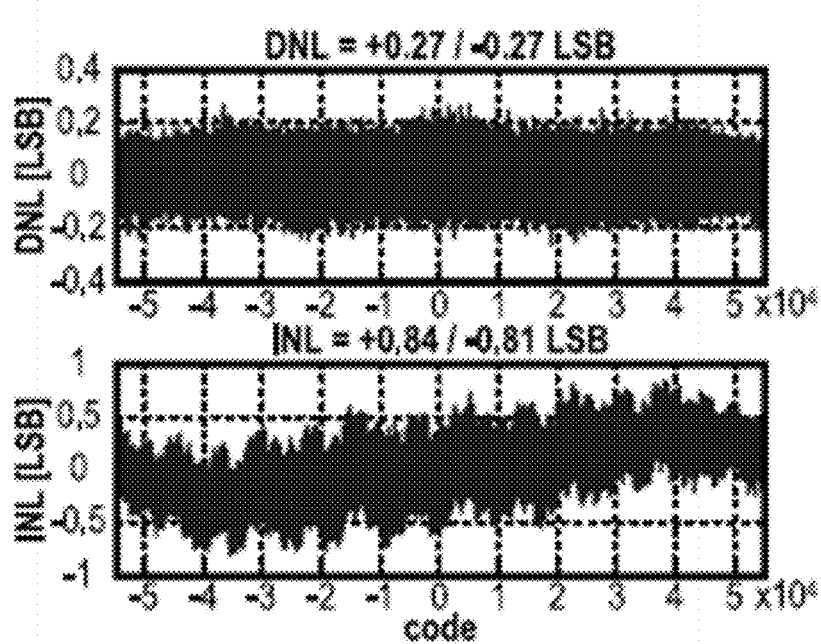
FIG. 15 depicts a plot showing the measured DNL and INL with DWA enabled.

FIG. 15 presents the measured differential nonlinearity (DNL) and integral nonlinearity (INL) with DWA circuit 215 enabled. With the DWA technique rotating the DAC 212 unit elements, the DNL and INL are 0.27 LSB and 0.84 LSB respectively. The result confirms that the DWA technique works well in the linear-exponential IADC 200 and the non-uniform weighting at the exponential phase 332 has less impact on the overall performance.

Figure 16:
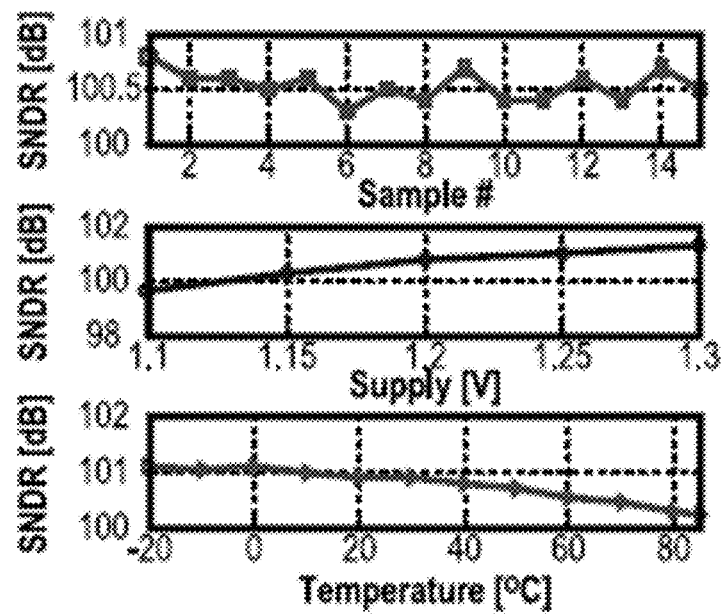
FIG. 16 depicts a plot showing the measured SNDR versus (1) number of sample, (2) supply voltage, and (3) temperature.

FIG. 16 shows the measured SNDR spread among 15 samples, as well as from −20° C. to 85° C. and from VDD=1.1-1.3 V, all within 1.2 dB variations.

TABLE II

Performance Summary of the Linear-Exponential IADC

| Parameter | This Work |
|---|---|
| Architecture | Linear-exponential IADC |
| Process (nm) | 65 |
| Supply (V) | 1.2 |
| Frequency (MHz) | 10.24 |
| Bandwidth (kHz) | 20 |
| Power (μW) | 550 |
| Peak SNDR (dB) | 100.8 |
| DR (dB) | 101.8 |
| FoMw (pJ/conv.) | 0.15 |
| FoMs (dB) | 176.4 |
| Area [mm²] | 0.13 |

Figure 17:
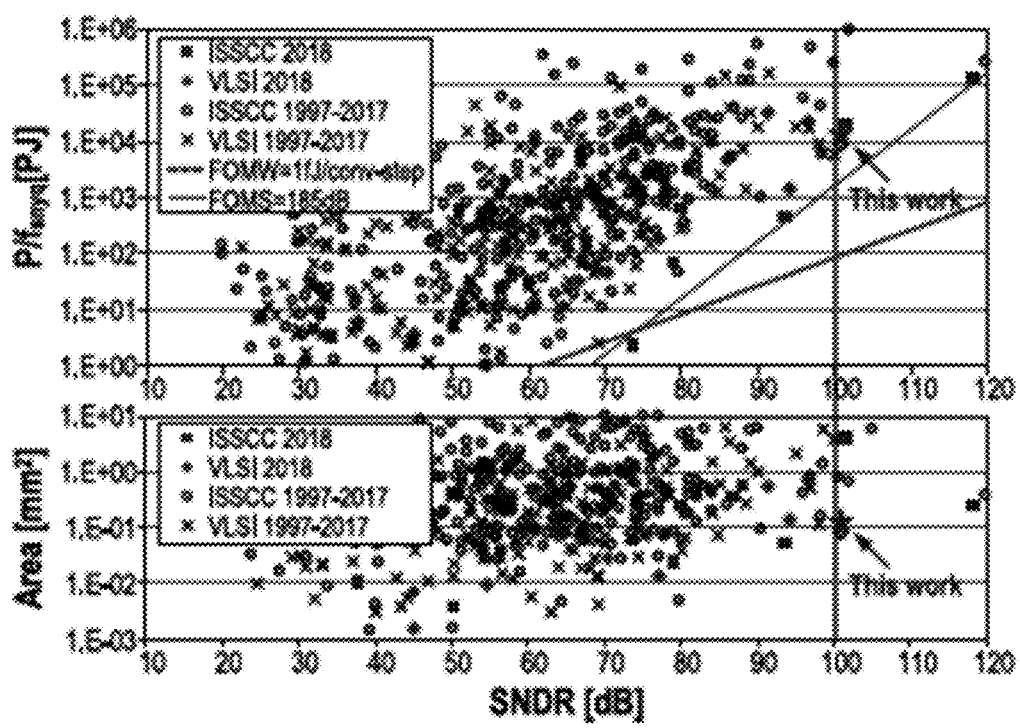
FIG. 17 depicts a plot comparing the linear-exponential IADC with the previous ISSCC and VLSI works.

Table II above shows the performance of the linear-exponential IADC 200. A comparison with the previous ISSCC and VLSI is shown in FIG. 17. The data for the previous ISSCC and VLSI are obtainable from a website of Stanford University [7]. The linear-exponential IADC 200 can achieve a peak SNDR of 100.8 dB and a DR of 101.8 dB, with a FoMS of 176.4 dB and a FoMW of 0.15 pJ/conv.step. The competitive figure of merit (FoM) and area under 1.2V supply in a 65 nm CMOS process, which can be integrated and implemented on a system on chip (SoC) or other semiconductor devices. Such SoC systems include many different components including one or more internal processors, core, controllers, interface circuitry, memories and so forth, such that the single integrated circuit acts as an entire embedded system.

E. CONCLUSION

The linear-exponential IADC 200 is a well-balanced system level ADC with considerations on the accumulation efficiency, the thermal noise penalty and the effectiveness of the DWA technique for DAC 212 mismatch error. In the initial 246 cycles of the linear phase 331, the IADC works as a first-order architecture and fully utilizes the oversampling operation on thermal noise suppression. After that, the circuit reconfigured as an exponential phase 332, boosts the SQNR exponentially in 10 clock cycles. It achieved the exponential accumulation with the ping-pong capacitor arrays 313 in the NC path 213. The uniform exponential weighting allows the DWA technique to work well in improving the linearity by rotating the multi-bit DAC 212 elements. With a 17-level quantizer 214, the integrator 211 can employ an energy-efficient complementary telescopic op-amp. Implemented in 65 nm CMOS with 1.2V supply, the IADC reaches an SNDR/DR of 100.8 dB/101.8 dB with 20 kHz BW, while consuming 550 µW, resulting in FoMW and FoMS of 0.15 pJ/conv.step and 176.4 dB respectively. The DWA technique produces high linearity with DNL/INL of 0.27 LSB/0.84 LSB.

The present disclosure may be embodied in other specific forms without departing from the spirit or essential characteristics thereof. The present embodiment is, therefore, to be considered in all respects as illustrative and not restrictive. The scope of the disclosure is indicated by the appended claims rather than by the preceding description, and all changes that come within the meaning and range of equivalency of the claims are therefore intended to be embraced therein.

F. LIST OF REFERENCES

There follows a list of references that are occasionally cited in the specification. Each of the disclosures of these references is incorporated by reference herein in its entirety.
[1] B. Wang, et al., "A 550 W 20 kHz BW 100.8 DB SNDR linear-exponential multi-bit incremental converter with 256-cycles in 65 nm CMOS," *Proc. IEEE Symp. VLSI Circuits*, June 2018, pp. 207-208.
[2] Wang, Biao, et al., "A 550-µW 20-kHz BW 100.8-dB SNDR Linear-Exponential Multi-Bit Incremental Σ Δ ADC With 256 Clock Cycles in 65-nm CMOS," *IEEE Journal of Solid-State Circuits*, 8 Jan. 2019, Vol. 54, No. 4.
[3] Y. Liu, et al., "A 105-dB SNDR, 10 kSps multi-level second-order incremental converter with smart-DEM consuming 280 µW and 3.3-V supply," *Proc. IEEE Eur. Solid-State Circuits Conf. (ESSCIRC)*, September 2013, pp. 371-374.
[4] P. Vogelmann, et al., "A 1.1 mW 200 kS/s incremental Σ Δ ADC with a DR of 91.5 dB using integrator slicing for dynamic power reduction," *IEEE Int. Solid-State Circuits Conf. (ISSCC) Dig. Tech. Papers*, February 2018, pp. 236-237.
[5] Y. Zhang, et al., "A 35 oW96.8 dB SNDR 1 kHz BW multi-step incremental ADC using multi-slope extended counting with a single integrator," *Proc. IEEE Symp. VLSI Circuits*, June 2016, pp. 24-25.
[6] T. Katayama, et al., "A 1.25 MS/s two-step incremental ADC with 100 dB DR and 110 dB SFDR," *Proc. IEEE Symp. VLSI Circuits*, June 2018, pp. 205-206.
[7] B. Murmann, "ADC Performance Survey 1997-2018," Online resources accessed on Jul. 16, 2018, available at http://web.stanford.edu/murmann/adcsurvey.html.

What is claimed is:

1. An linear-exponential incremental analog-to-digital converter for digitizing an analog input voltage to obtain a decimation filter output, comprising:
an analog modulator having an input for receiving the analog input voltage and an output, wherein the analog modulator comprises a first integrator, an adder, a quantizer, a noise-coupling (NC) path, a data weighted averaging (DWA) circuit, and a digital-to-analog converter (DAC); and
a decimation filter having an input for receiving signals from the output of the analog modulator, wherein:
the decimation filter further comprises a $1^{st}$ order accumulator, an exponential accumulator, and a decimator; and
the decimation filter is configured to generate the decimation filter output;
wherein:
the first integrator, the adder, and the quantizer are activated during a linear phase to accumulate a signal linearly;
the NC path and the exponential accumulator are activated during an exponential phase to create an exponentially accumulating loop for boosting a signal-to-quantization-noise ratio (SQNR); and
the linear phase and the exponential phase are configured to operate for $N_L$ and $N_E$ clock cycles respectively, wherein $N_L$ and $N_E$ are determined in accordance with a clock cycles distribution.

2. The linear-exponential incremental analog-to-digital converter of claim 1, wherein the first integrator is configured to convert a sum of signals received at an input terminal to an output signal indicative of an integral, with respect to time, of the sum of the signals received.

3. The linear-exponential incremental analog-to-digital converter of claim 2, wherein the first integrator utilizes a chopping technique using a non-overlapping chopping clock.

4. The linear-exponential incremental analog-to-digital converter of claim 2, wherein the first integrator implements a complementary telescopic cascode architecture.

5. The linear-exponential incremental analog-to-digital converter of claim 1, wherein the NC path feeds a quantizer noise back to an input of the quantizer.

6. The linear-exponential incremental analog-to-digital converter of claim 5, wherein the NC path comprises ping-pong capacitor arrays having a pair of matching capacitors ($C_{ho}$ and $C_{he}$) and a plurality of switches for charging the pair of matching capacitors at alternating clock cycles.

7. The linear-exponential incremental analog-to-digital converter of claim 6, wherein the ping-pong capacitor arrays further comprise an even part and an odd part, wherein:
the even and odd parts are controllable by the plurality of switches; and
the even and odd parts are distinguished and interchangeable with each other.

8. The linear-exponential incremental analog-to-digital converter of claim 6, wherein one of the matching capacitors in the ping-pong capacitor arrays is charged one clock cycle before the exponential phase as a preparation for the exponential phase.

9. The linear-exponential incremental analog-to-digital converter of claim 1, wherein clock cycle distribution is determined such that the linear phase is optimized for thermal noise suppression while the exponential phase is optimized for SQNR boosting.

10. The linear-exponential incremental analog-to-digital converter of claim 1, wherein the clock cycles distribution between the linear phase and the exponential phase is selected from 244/12, 245/11, 246/10, 247/9, and 248/8, when the linear-exponential incremental analog-to-digital converter has an oversampling ratio (OSR) of 256 clock cycles.

11. The linear-exponential incremental analog-to-digital converter of claim 1, wherein the output of the analog modulator is coupled to the DWA circuit and an output of the DWA circuit is further coupled to the DAC, forming a feedback path.

12. The linear-exponential incremental analog-to-digital converter of claim 1, wherein the quantizer is a 17-level quantizer for reducing swings of an op-amp for the integrator.

13. The linear-exponential incremental analog-to-digital converter of claim 12, wherein the quantizer is configured to have a reference scaled down by half.

14. The linear-exponential incremental analog-to-digital converter of claim 1, wherein the analog input voltage is first coupled to a bootstrapped switch, wherein the bootstrapped switch is configured to enable at a delayed clock cycle for charging a sampling capacitor ($C_{DAC}$).

15. The linear-exponential incremental analog-to-digital converter of claim 14, wherein the sampling capacitor is electrically connected to a negative input terminal of the first integrator when the bootstrapped switch is disabled.

16. The linear-exponential incremental analog-to-digital converter of claim 14, wherein the sampling capacitor has a capacitance matched with a capacitance of a capacitor ($C_F$) in the first integrator.

17. The linear-exponential incremental analog-to-digital converter of claim 1, wherein the analog modulator is configured to operate with a low-distortion feedforward structure with a feedforward capacitor for coupling the analog input voltage to an input of the adder when the first integrator is reset.

18. The linear-exponential incremental analog-to-digital converter of claim 1, wherein the decimator is configured in accordance with a weighting function:

$$W(i) = \begin{cases} 2^{N_E+1} - 1, & i \in [1, N_L] \\ 2^{N-i+1} - 1, & i \in [N_L+1, N] \end{cases}$$

wherein:

$N_L$ is a number of clock cycles for the linear phase;

$N_E$ is a number of clock cycles for the exponential phase; and

N is a total number of clock cycles.

19. The linear-exponential incremental analog-to-digital converter of claim 1, wherein the exponential accumulator has a transfer function of:

$$\left( \frac{1}{1 - (1 + k_e)z^{-1}} \right)$$

wherein:

$k_e$ is a coefficient related to a speed of accumulation; and z is a discrete-time z-transform variable.

20. The linear-exponential incremental analog-to-digital converter of claim 19, wherein $k_e$ equals to 1.

* * * * *